(12) United States Patent
Tsao et al.

(10) Patent No.: US 12,062,535 B2
(45) Date of Patent: Aug. 13, 2024

(54) PARTICLE REMOVAL METHOD IN SEMICONDUCTOR FABRICATION PROCESS

(71) Applicant: TAIWAN SEMICONDUCTOR MANUFACTURING COMPANY LTD., Hsinchu (TW)

(72) Inventors: Chih-Ming Tsao, Miaoli County (TW); Po-Cheng Chen, Kaohsiung (TW); Deng-An Wang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/377,820

(22) Filed: Jul. 16, 2021

(65) Prior Publication Data
US 2023/0018029 A1 Jan. 19, 2023

(51) Int. Cl.
*H01L 21/02* (2006.01)
*B01D 47/02* (2006.01)
*B01D 50/00* (2022.01)
*H01L 21/67* (2006.01)

(52) U.S. Cl.
CPC ...... *H01L 21/02057* (2013.01); *B01D 47/028* (2013.01); *B01D 50/00* (2013.01); *H01L 21/02334* (2013.01); *H01L 21/67051* (2013.01)

(58) Field of Classification Search
CPC ...... B01D 47/028; B01D 50/00; B01D 47/06; H01L 21/02057; H01L 21/02334; H01L 21/67051
See application file for complete search history.

(56) References Cited

U.S. PATENT DOCUMENTS

| | | | | | |
|---|---|---|---|---|---|
| 1,222,541 | A | * | 4/1917 | Donham | B01D 47/06 96/356 |
| 1,831,782 | A | * | 11/1931 | Strindberg | B01D 46/12 96/265 |
| 1,922,688 | A | * | 8/1933 | Kamrath | B01D 47/14 55/330 |
| 2,387,473 | A | * | 10/1945 | Spitzka | F24F 5/0035 55/467 |

(Continued)

FOREIGN PATENT DOCUMENTS

TW 202042910 A 12/2020

*Primary Examiner* — Christopher P Jones
*Assistant Examiner* — Phillip Y Shao
(74) *Attorney, Agent, or Firm* — WPAT LAW; Anthony King

(57) ABSTRACT

A system for processing a semiconductor wafer is provided. The system includes a processing tool. The system also includes gas handling housing having a gas inlet and a gas outlet. The system further includes an exhaust conduit fluidly communicating with the processing tool and the gas inlet of the gas handling housing. In addition, the system includes at least one first filtering assembly and at least one second filtering assembly. The first filtering assembly and the second filtering assembly are positioned in the gas handling housing and arranged in a series along a flowing path that extends from the gas inlet to the gas outlet of the gas handling housing. Each of the first filtering assembly and the second filtering assembly comprises a plurality of wire meshes stacked on top of another.

20 Claims, 13 Drawing Sheets

(56) References Cited

U.S. PATENT DOCUMENTS

| | | | | |
|---|---|---|---|---|
| 2,523,441 A * | 9/1950 | McKamy | B01D 47/06 | 55/494 |
| 3,006,436 A * | 10/1961 | Starbuck | F24F 3/14 | 261/95 |
| 3,375,058 A * | 3/1968 | Petersen | C01B 17/76 | 423/2 |
| 3,538,657 A * | 11/1970 | Macrow | B01D 47/16 | 415/206 |
| 3,599,398 A * | 8/1971 | Jaeger | B01D 47/10 | 95/149 |
| 3,733,789 A * | 5/1973 | Rebours | B01D 50/00 | 96/322 |
| 3,856,487 A * | 12/1974 | Perez | B01D 47/06 | 96/240 |
| 3,926,592 A * | 12/1975 | Leva | B01D 50/00 | 96/299 |
| 3,992,177 A * | 11/1976 | Welteroth | B01D 46/02 | 55/288 |
| 4,058,379 A * | 11/1977 | Cheng | B01D 46/04 | 55/501 |
| 4,120,671 A * | 10/1978 | Steinmeyer | B01D 46/003 | 55/486 |
| 4,153,432 A * | 5/1979 | Beman | B01D 47/10 | 95/224 |
| 4,235,610 A * | 11/1980 | Richard | B01D 46/4281 | 55/424 |
| 4,249,920 A * | 2/1981 | Vesel | B01D 47/028 | 96/299 |
| 4,676,811 A * | 6/1987 | Wade | B01D 50/60 | 96/275 |
| 4,744,806 A * | 5/1988 | Ozolins | B01D 46/10 | 210/DIG. 5 |
| 4,787,920 A * | 11/1988 | Richard | B01D 50/60 | 95/287 |
| 4,818,257 A * | 4/1989 | Kennedy | B01D 46/0031 | 95/286 |
| 4,940,475 A * | 7/1990 | Yaeger | F24F 3/14 | 55/440 |
| 4,997,561 A * | 3/1991 | Schutz | B01D 29/11 | 210/232 |
| 5,262,094 A * | 11/1993 | Chuang | B01D 3/22 | 261/114.1 |
| 5,264,137 A * | 11/1993 | McCullough, Jr. | G01N 27/44747 | 210/243 |
| 5,429,668 A * | 7/1995 | Teague | B01D 46/2407 | 95/212 |
| 5,453,116 A * | 9/1995 | Fischer | F01N 3/0212 | 95/278 |
| 6,019,818 A * | 2/2000 | Knapp | B01D 47/06 | 96/272 |
| 6,350,302 B1 * | 2/2002 | Hallstead, Sr. | B01D 53/18 | 96/240 |
| 6,478,859 B1 * | 11/2002 | Ferlin | B01D 47/06 | 96/363 |
| 7,291,196 B1 * | 11/2007 | Lerner | B01D 46/003 | 264/DIG. 48 |
| 8,142,551 B2 * | 3/2012 | Prud'homme | B01D 46/48 | 95/107 |
| 9,457,297 B2 * | 10/2016 | Brown | B01D 29/52 | |
| 9,713,785 B2 * | 7/2017 | Novosel | B01D 46/0045 | |
| 2013/0056035 A1 * | 3/2013 | Kraai | B01D 46/78 | 134/25.1 |

* cited by examiner

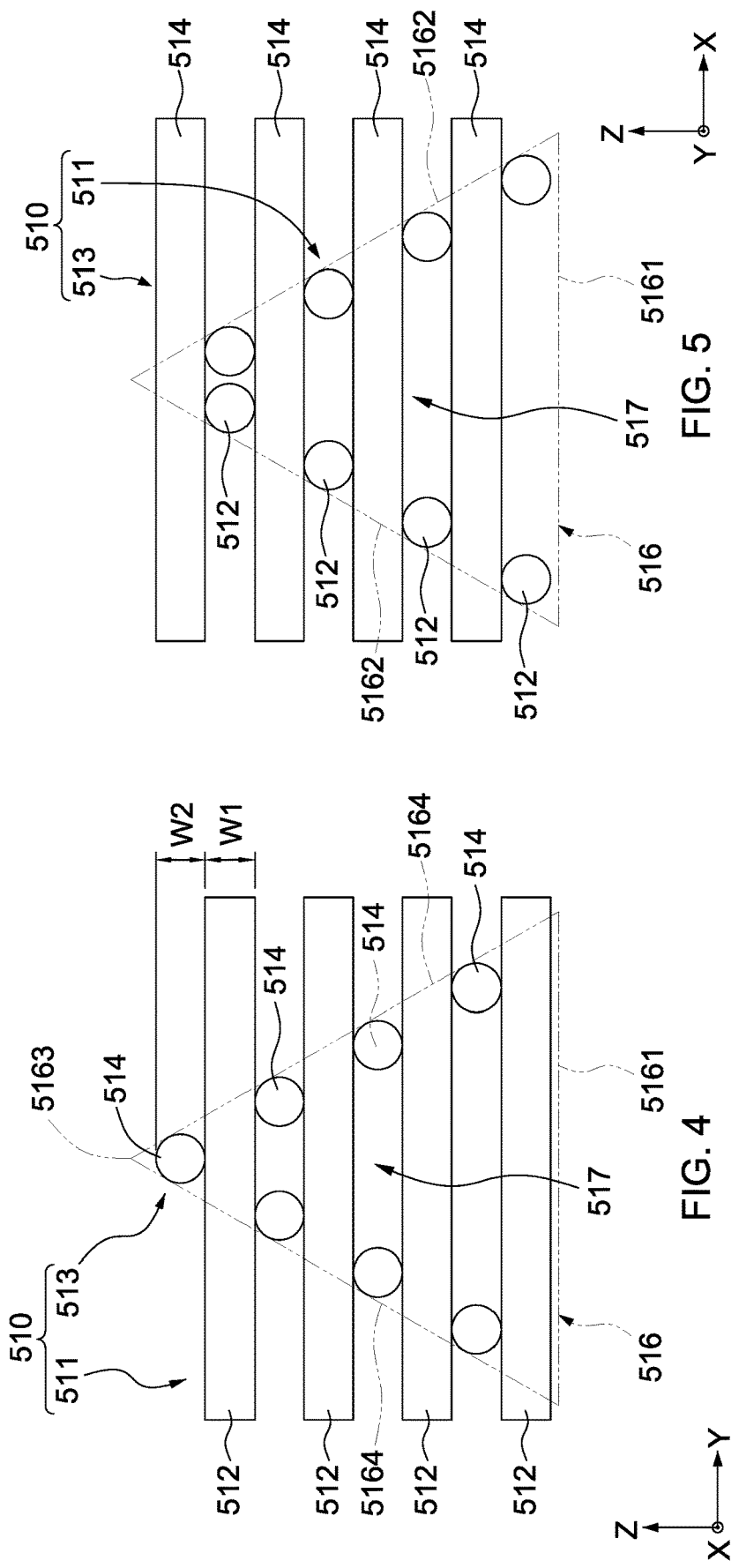

PARTICLE REMOVAL METHOD IN SEMICONDUCTOR FABRICATION PROCESS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning or processing the substrate and/or the various material layers using lithography to form circuit components and elements thereon and form integrated circuits. Integrated circuits are typically manufactured on a single semiconductor wafer. The individual dies are singulated by sawing the integrated circuits along a scribe line. The individual dies are then packaged separately, in multi-chip modules, or in other types of packaging, for example.

During the manufacturing of the semiconductor devices, various processing steps are used to fabricate integrated circuits on a semiconductor wafer. For example, semiconductor devices are formed on a semiconductor substrate using several wet chemical processing operations. The wet processing operations may include cleaning operations, stripping operations and etching operations in which the chemicals of a chemical bath react with a material being etched or removed.

Although existing devices and methods for wet chemical processing operations have been generally adequate for their intended purposes, they have not been entirely satisfactory in all respects. Consequently, it would be desirable to provide a solution for performing wet chemical processing operations.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIG. 4 shows a cross-section view of a three dimensional structure formed in a wire mesh, in accordance with some embodiments.

FIG. 5 shows a cross-section view of a three dimensional structure formed in a wire mesh, in accordance with some embodiments.

DETAILED DESCRIPTION

Figure 1:
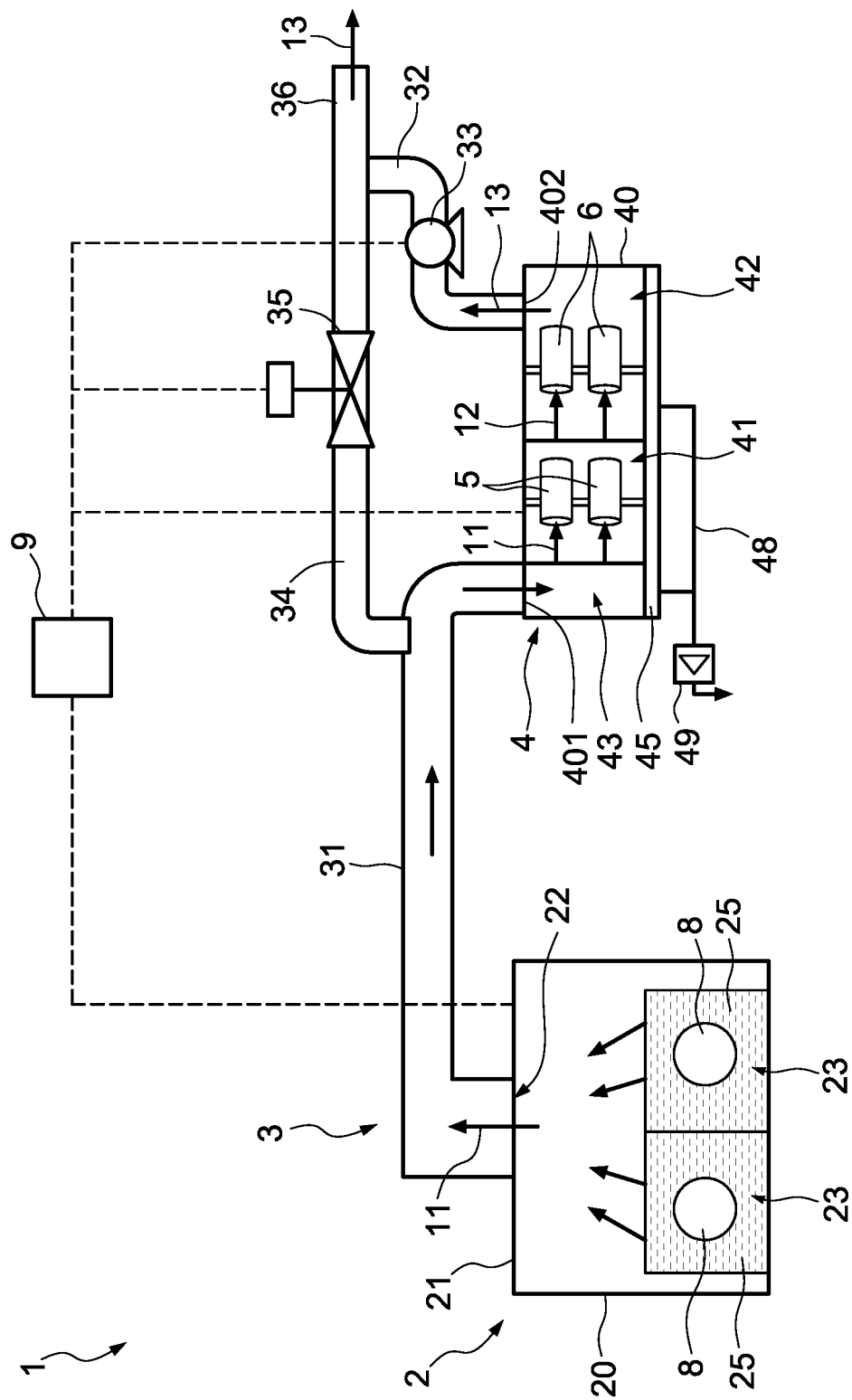
FIG. 1 shows a schematic view of a semiconductor processing system, in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

Chemical solutions and gases are used in different industries for manufacturing, however, the exhaust or byproducts produced during the process become a source of environment pollution. Authorities are tending to enforce stricter regulation, such as Environmental Impact Assessment (EIA), to push manufacturers improving exhaust emission quality and waste management. A recent trends shows investment on exhaust apparatus increases from manufacturing in order to meet green policy requirement while still sustain productivity. Manufacturing tools in semiconductor fabrication are often connected to an exhaust apparatus. Particles, which may be formed because of unexpected reactions that originate from mixture of different exhaust gases or chemical in the semiconductor processing tool, are often observed in the exhaust apparatus. To maintain the exhaust apparatus, it is necessary to be moved offline in order to conduct a regular inspection or an ex-situ clean process. Another issue is abrupt malfunction of the exhaust apparatus that occurs because an exhausting pressure drop is detected due to, for example, a filter clogging. The abrupt malfunction stops manufacturing equipment's and causes product scrap.

Embodiments of this disclosure provide a robust filtering methodology or tool for an exhaust apparatus with a use of a number of filtering assemblies formed with wire meshes so as to maintain a compatible productivity of a semiconductor processing system.

FIG. 1 shows a schematic diagram of a semiconductor processing system 1, in accordance with some embodiments. In some embodiments, the semiconductor processing system 1 includes a processing tool 2 and an exhaust apparatus 3. The procession tool 2 is configured to perform a semiconductor process, for example, a wet chemical process over one or more substrates 8.

The substrate 8 may be made of silicon or other semiconductor materials. Alternatively or additionally, the substrate 8 may include other elementary semiconductor materials such as germanium (Ge). In some embodiments, the substrate 8 is made of a compound semiconductor such as silicon carbide (SiC), gallium arsenic (GaAs), indium arsenide (InAs), or indium phosphide (InP). In some embodiments, the substrate 8 is made of an alloy semiconductor such as silicon germanium (SiGe), silicon germanium carbide (SiGeC), gallium arsenic phosphide (GaAsP), or gallium indium phosphide (GaInP). In some embodiments, the substrate 8 includes a photoresist layer. In some other embodiments, the substrate 8 may be a silicon-on-insulator (SOI) or a germanium-on-insulator (GOI) substrate. In some embodiments, a photoresist layer (not shown in figures) is formed in the substrate for photolithography process.

In some embodiments, the processing tool 2 includes a chamber 20, and a number of tanks 23 are positioned in the chamber 20. The tanks 23 serve as the processing bath, i.e., the bath in which substrate 8 are processed. In some embodiments, each of the tanks 23 is formed by a bottom wall and a sidewall which is joined perpendicular to the bottom wall forming a fluid-tight enclosure. The bottom wall and the sidewall can be constructed of a corrosion-resistant material such as panels of stainless steel or steel panels coated with a corrosion-resistant material such as Teflon.

The chemical solutions 25 held by the tanks 23 vary by the wet chemical process to be performed in the processing tool 2. In some embodiments, the wet chemical process performed in the procession tool 2 is a cleaning process after a photoresist striping, and the tank 23 holds a chemical solution 25 such as an alkaline solution. The alkaline solution includes ammonium hydroxide ($NH_4OH$), sodium hydroxide (NaOH), potassium hydroxide (KOH), lithium hydroxide (LiOH), amine, or a combination thereof. In some embodiments, the alkaline solution includes quaternary ammonium salt. In some embodiments, the alkaline solution includes tetramethylammonium hydroxide (TMAH). In some embodiments, the alkaline solution includes deionized water and/or weak acid to adjust a pH value of the alkaline solution. In some other embodiments, the wet chemical process performed in the procession tool 2 is an etching process, and the tanks 23 holds a chemical solution 25 such as hot phosphoric acid. The hot phosphoric acid in the tanks 23 may be maintained at a temperature within a range of about 70° C. to about 160° C., or at other suitable temperatures.

The exhaust apparatus 3 is configured to process an exhaust gas 11 from the processing tool 2 before the exhaust gas 11 is discharged to the environment. In some embodiments, the exhaust apparatus 3 includes a gas handling tool 4 and a number of conduits, such as first exhausting conduit 31, second exhaust conduit 32, bypass conduit 34 and discharging conduit 36. The first exhausting conduit 31 is fluidly communicated with the processing tool 2 and the gas handling tool 4. Specifically, the first exhausting conduit 31 is connected between a ventilation hole 22, which is formed on a top wall 21 of the chamber 20, and a gas inlet 401 of the gas handling tool 4. The second exhausting conduit 32 is fluidly communicated with a gas outlet 402 of the gas handling tool 4 and the discharge conduit 36. The bypass conduit 34 is fluidly communicated with the first exhausting conduit 31 and the discharge conduit 36. It will be noted that the number of conduits employed for the exhaust apparatus 3 may be varied as desired. For example, the bypass conduit 34 is omitted.

In some embodiments, the exhaust apparatus 3 also includes one or more fluid regulating members connected to the conduits to control the gas flow in the exhaust apparatus 3. In one exemplary embodiment, the exhaust apparatus 3 includes a fan 33 connected to the second conduit 32. The fan 33 is configured to drive the exhaust gas 11 flowing from the processing tool 2 to pass through the gas handling tool 4. In addition, the fan 33 is configured to drive a filtered gas 13 processed by the gas handling tool 4 to the discharge conduit 36. In another exemplary embodiment, the exhaust apparatus 3 includes a valve 35 connected to the bypass conduit 34. The valve 35 is configured to control a portion of the exhaust gas 11 from the first exhausting conduit 31 to the discharge conduit 36 by passing the bypass conduit 34 rather than the gas handling tool 4.

The gas handling tool 4 is configured to remove particles from the exhaust gas 11 received from the processing tool 2 so as to make the exhaust gas meet a requirement for discharge of a waste gas. In some embodiments, the gas handling tool 4 includes a gas handling housing 40, a number of filtering assemblies, such as two first filtering assemblies 5 and two second filtering assemblies 6, positioned in the gas handling housing 40 for cleaning the exhaust gas received from the processing tool 2.

In some embodiments, the gas handling housing 40 includes at least two chambers, and there is at least one filtering assembly positioned in each of the chambers for cleaning a gas passing therethrough. In the exemplary embodiment shown in FIG. 1, the gas handling housing 40 includes an intake chamber 43, a first chamber 41 and a second chamber 42. The intake chamber 43, the first chamber 41 and the second chamber 42 are consequentially arranged in series between the gas inlet 401 and the gas outlet 402. For example, the intake chamber 43 is immediately connected to the gas inlet 401, the second chamber 42 is immediately connected to the gas outlet 402, and the first chamber 41 is connected between the intake chamber 43 and the second chamber 42. Namely, the intake chamber 43, the first chamber 41 and the second chamber 42 are arranged along a flowing path of gas that extends from the gas inlet 401 to the gas outlet 402.

In some embodiments, in each of the first chamber 41 and the second chamber 42, there are two or more filtering assemblies positioned therein. For example, as shown in FIG. 1, there are two first filtering assemblies 5 located in the first chamber 41 and positioned in a parallel manner. Additionally, there are two second filtering assemblies 6 located in the second chamber 42 and positioned in a parallel manner. However, it will be appreciated that many variations and modifications can be made to embodiments of the disclosure. In some embodiments, the number of the filtering assemblies positioned in the first chamber 41 is different from the number of the filtering assemblies positioned in the second chamber 42. For example, one first filtering assembly is positioned in the first chamber 41, and two or more than two second filtering assemblies 6 are positioned in the second chamber 42. Alternatively, two or more than two first filtering assemblies 5 are positioned in the first chamber 41, and one second filtering assembly 6 is positioned in the second chamber 42. The method of how the first and second filtering assemblies 5 and 6 are placed in the first and second chambers 41 and 42 will be described in more details in the embodiments discussed with respect to FIGS. 8-10.

In some embodiments, the gas handling tool 4 further includes a drain conduit 45, a drain line 48 and a pump 49. The drain conduit 45 is positioned below the first chamber 41 and the second chamber 42. Specifically, the drain conduit 45 is positioned below the two first filtering assemblies 5 and the two second filtering assemblies 6 for collecting liquid dripping from the two first filtering assemblies 5 and the two second filtering assemblies 6. The drain line 48 is connected to the drain conduit 45, and the pump 49 is connected to the drain line 48 for actuating a flow of liquid from the drain conduit 45 to a waste handling apparatus (not shown in figures).

Structural features of the first filtering assembly 5, in accordance with some embodiments, are described hereinafter with reference to FIGS. 2A to 7. In the description below, a proximal end of the first filtering assembly 5 refers to an end of the filtering assembly that allows a gas flow entering the filtering assembly, and a distal end of the first filtering assembly 5 refers to an end opposite to the proximal end.

Figure 2B:
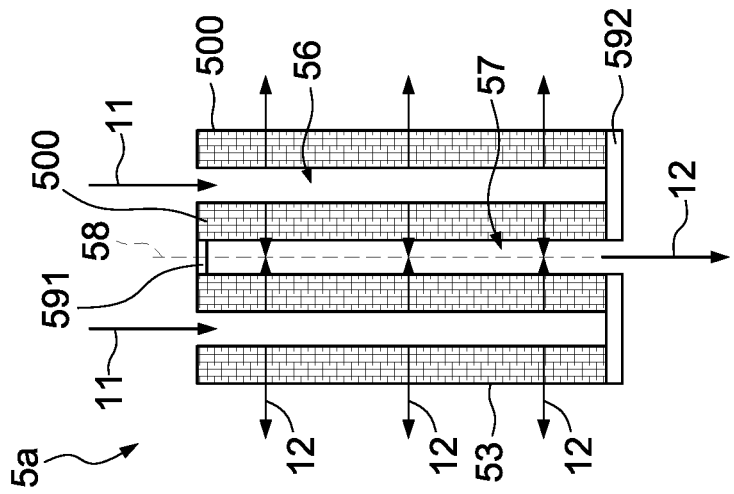
FIG. 2B shows a cross-section view of a filtering assembly, in accordance with some embodiments.
Figure 2A:
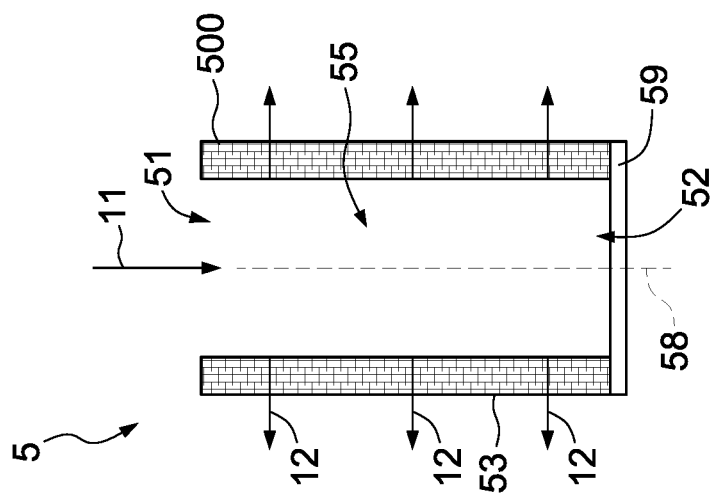
FIG. 2A shows a cross-section view of a filtering assembly, in accordance with some embodiments.

In some embodiments, as shown in FIG. 2A, the first filtering assembly 5 includes a tubular-shaped filtering structure 500 and a plate 59. The tubular-shaped filtering structure 500 surrounds a first longitudinal axis 58 along which the first filtering assembly 5 extends. The tubular-shaped filtering structure 500 defines a channel 55 extending along the first longitudinal axis 58. A distal end 52 of the channel 55 is covered by the plate 59, and a proximal end 51 of the channel is open. As such, the exhaust gas 11 enters the first filtering assembly 5 via the proximal end 51 of the channel 55, and leaves the first filtering assembly 5 via the tubular-shaped filtering structure 500 along a radial direction of the first filtering assembly 5 as indicated by arrows shown in FIG. 2A. In some embodiments, the flowing direction of the exhaust gas 11 as passing through the tubular-shaped filtering structure 500 is perpendicular to the wire meshes (which will be described in detail later) in the tubular-shaped filtering structure 500.

However, it will be appreciated that many variations and modifications can be made to embodiments of the disclosure. In some other embodiment, the first filtering assembly includes two or more tubular-shaped filtering structures 500. For example, as shown in FIG. 2B, the first filtering assembly 5a includes two tubular-shaped filtering structures 500. The two tubular-shaped filtering structures 500 are arranged concentrically with respect to the first longitudinal axis 58 of the first filtering assembly 5a. One of the tubular-shaped filtering structures 500 that is positioned in an inner side of the first filtering assembly 5a defines a channel 57. A plate 591 covers a proximal end of the channel 57. In addition, a channel 56 is defined between the two tubular-shaped filtering structures 500. The channel 56 has a ring shape as seen along a direction that is parallel to the first longitudinal axis 58. A plate 592, which has a ring shape, covers a distal end of the channel 56. As such, an exhaust gas 11 can enter the first filtering assembly 5a via the proximal end of the channel 56, and a filtered gas can leave the first filtering assembly 5a by passing both tubular-shaped filtering structures 500 along a radial direction of the first filtering assembly 5a as indicated by arrows.

Figure 3B:
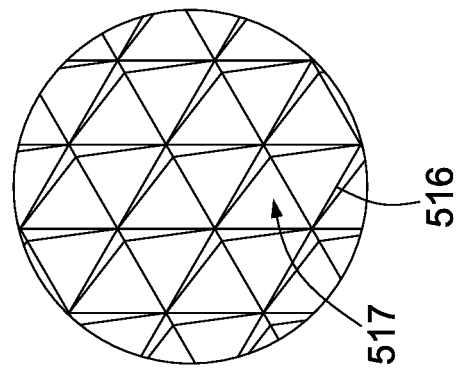
FIG. 3B shows an enlarged view of an A region of one of the wire meshes in FIG. 3A.
Figure 3A:
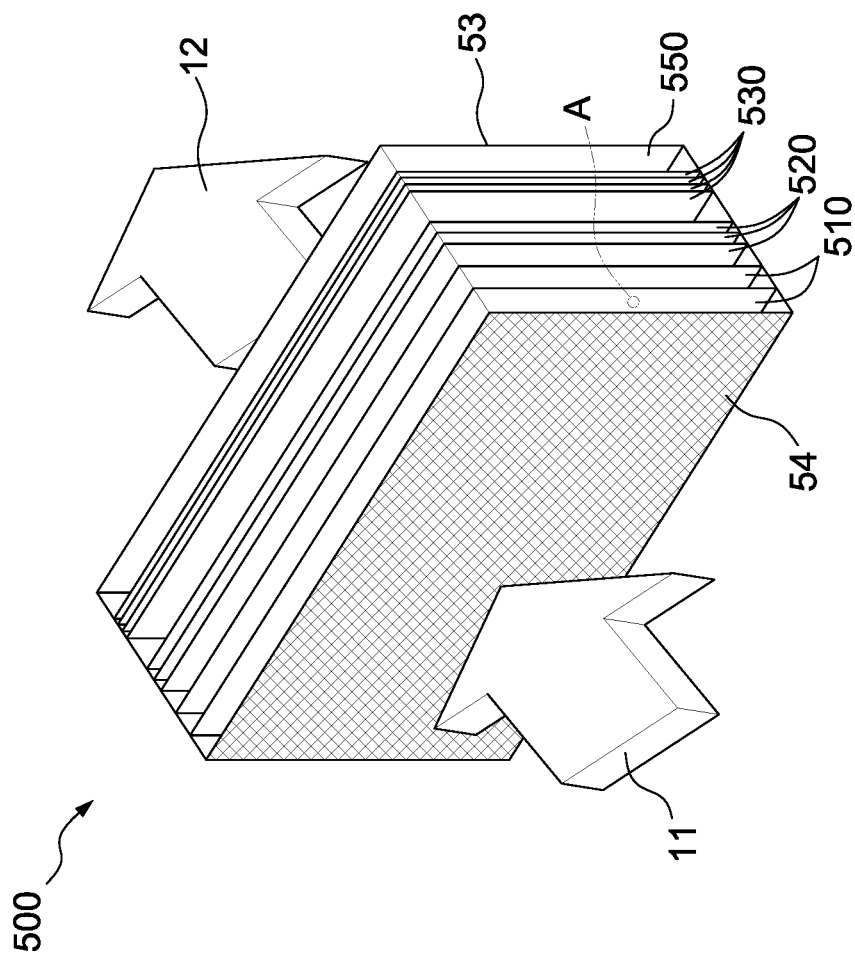
FIG. 3A shows a schematic view of a filtering assembly including a number of wire meshes, in accordance with some embodiments.

FIG. 3A shows a schematic view of a filtering assembly including a number of wire meshes, in accordance with some embodiments. In some embodiments, the tubular-shaped filtering structure 500 includes a number of wire meshes, such as two first wire meshes 510, three second wire meshes 520 and four third wire meshes 530. The first wire meshes 510, the second wire meshes 520 and the third wire meshes 530 are stacked on top of another and expanding in a plane that is parallel to an inner surface 54 and an outer surface 53 of the tubular-shaped filtering structure 500. The inner surface 54 and the outer surface 53 may include a thin shell with a number of gas holes formed thereon.

The inner surface 54 and the outer surface 53 are arranged such that the wire meshes 510, 520 and 530 positioned in an interior 550 formed between the inner surface 54 and the outer surface 53 are fixed in place. The first wire meshes 510 are located closer to the inner surface 54 than the second wire meshes 520 and the third wire meshes 530, and the third wire meshes 530 are located closer to the outer surface 53 than the first wire meshes 510 and the second wire meshes 520. However, it will be appreciated that many variations and modifications can be made to embodiments of the disclosure. In some other embodiments, the inner surface 54 and the outer surface 53 are omitted. The first wire meshes 510, the second wire meshes 520 and the third wire meshes 530 are connected to each other by, for example, an adhesive material.

In some embodiments, each of the first wire meshes 510, the second wire meshes 520 and the third wire meshes 530 includes a number of three-dimensional structures for filtering particles passing therethrough. For example, as shown in FIG. 3B, the first wire meshes 510 includes a number of three-dimensional structures 516 arranged in an array. The three-dimensional structures 516 may be formed with any cross section, for example triangular, elliptical, and square or the like. The three-dimensional structures 516 may also include a recess 517 exposed and facing toward where the inner surface 54 is located. In embodiments shown in FIG. 3B, each of the three-dimensional structures 516 has a shape of a quadrangular pyramid shape, with a square cross section.

Figure 6A:
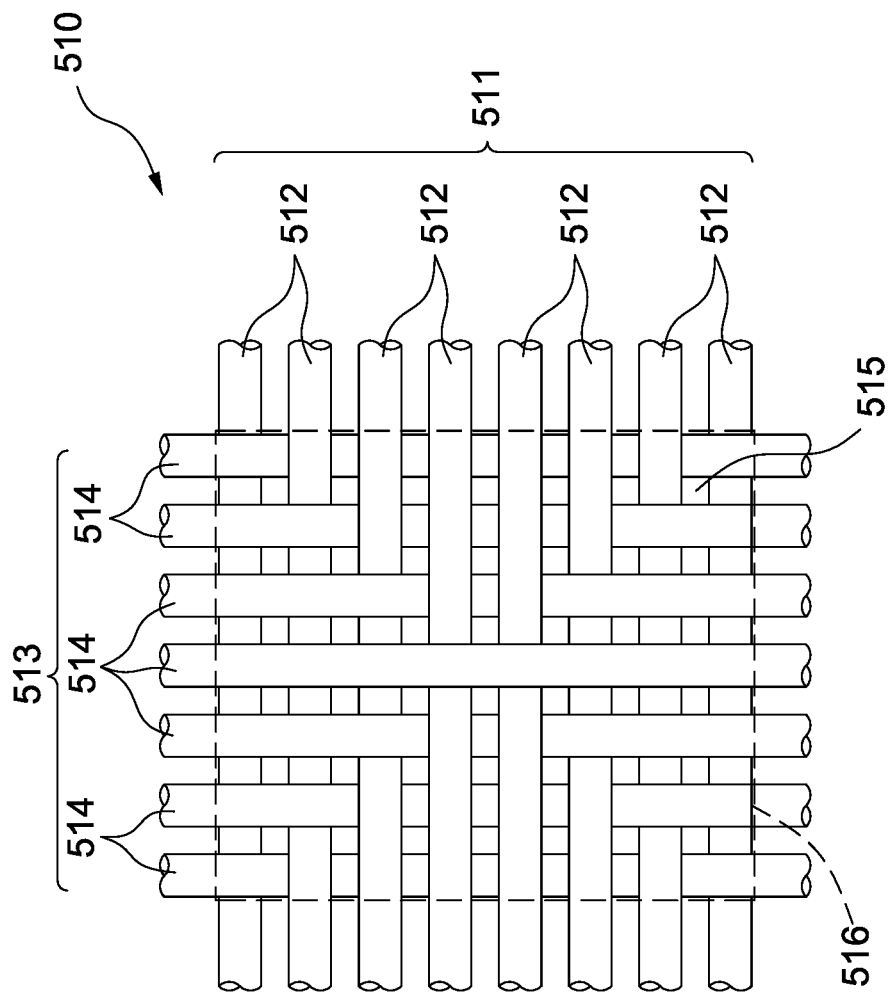
FIG. 6A shows a top schematic view of a three dimensional structure formed in a wire mesh, in accordance with some embodiments.

FIG. 4 shows a cross-sectional view of the three-dimensional structures 516 as seen in an X-axis direction, FIG. 5 shows a cross-sectional view of the three-dimensional structures 516 as seen in a Y-axis direction, and FIG. 6A shows a top view of the three-dimensional structures 516. In some embodiments, the three-dimensional structure 516 is formed with a first group of filaments 511 and a second group of filaments 513. The first group of filaments 511 includes a number of filaments 512, and the second group of filaments 513 includes a number of filaments 514.

As shown in FIG. 4, one of the filaments 514 is arranged on an apex 5163 of the three-dimensional structures 516, and the remaining filaments 514 are arranged on two opposite lateral surfaces 5164 of the three-dimensional structures 516, which are arranged in the Y-axis direction. The filaments 514 extends parallel to the base 5161 of the three-dimensional structures 516, and the filaments 514 on the same lateral surface 5164 are spaced with a distance that is equal to a width W2 of the filaments 512.

As shown in FIG. 5, the filaments 512 are arranged on two opposite lateral surfaces 5162 of the three-dimensional structures 516, which are arranged in the X-axis direction. The filaments 512 extends parallel to the base 5161 of the three-dimensional structures 516, and the filaments 512 on the same lateral surface 5162 are spaced with a distance that is equal to a width W1 of the filaments 514. The width W1 of the filaments 514 may be the same as the width W2 of the filaments 512.

After the filaments 512 and 514 are woven, as shown in FIG. 6A, a ladder-shaped structure is formed with a number of through holes 515 defined at intersections of the filaments 512 and the filaments 514. In some embodiments, the number of through holes 515 per inch is in a range from about 30 to about 40. The through holes 515 allow a passing of the exhaust gas 11 received from the processing tool 2 (FIG. 1.) The size of the through holes 515 depends on a width of the filaments 512 and 514 in the wire mesh 511. In one exemplary embodiment of the present disclosure, the widths of the filaments 512 and 514 are in a range of 0.05 mm to about 0.94 mm. The filaments 512 and 514 may be made of, for example, polypropylene or the like. The filaments 512 and 514 may have cylindrical shape or any other suitable shape.

Structural features of the second and third wire meshes 520 and 530, in accordance with some embodiments, are similar to that of the wire meshes 510 described above, and will not be repeated for the sake of brevity.

In some embodiments, the number of through holes per inch in the second or the third wire meshes 520 and 530 is also in a range from about 30 to about 40. In addition, the second wire meshes 520 are formed with filaments having a width greater than the filaments 512 and 514 of the first wire mesh 510, and the third wire meshes 530 are formed with filaments having a width greater than the filaments of the second wire mesh 520. Therefore, the size of through holes in the first wire meshes 510 is greater than the size of the through holes in the second wire meshes 520, and the size of through holes in the second wire meshes 520 is greater than the size of the through holes in the third wire meshes 530.

Figure 6B:
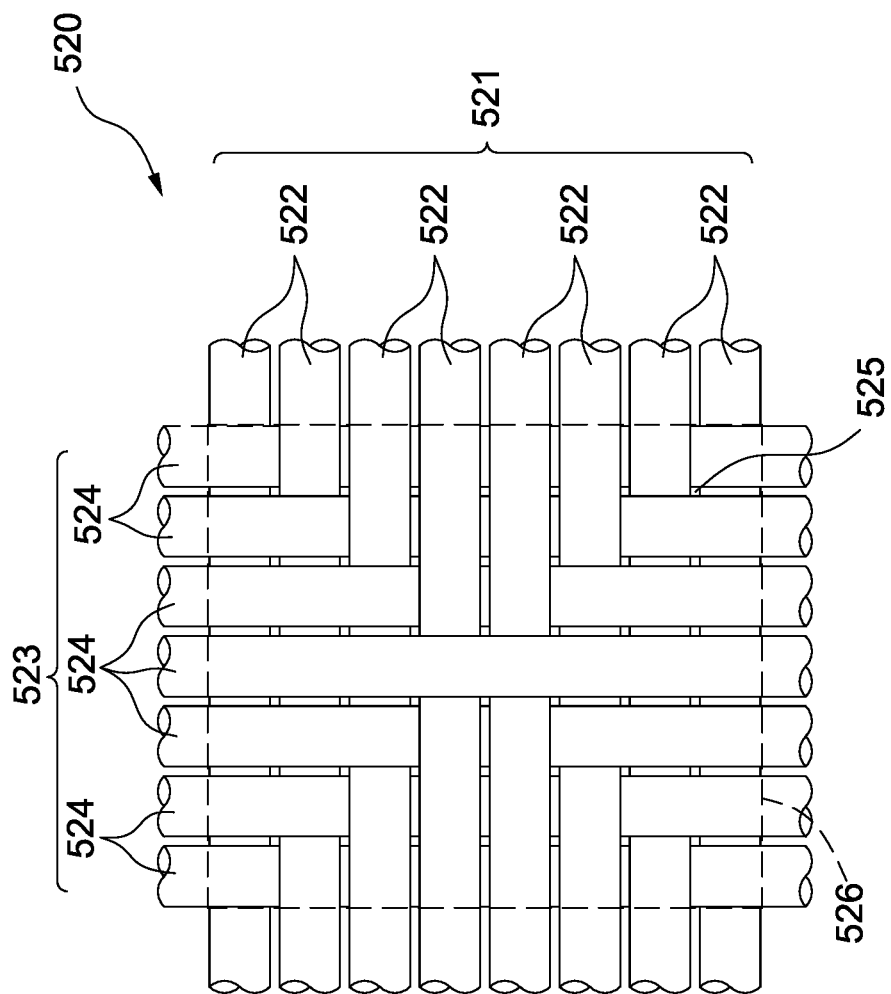
FIG. 6B shows a top schematic view of a three dimensional structure formed in a wire mesh, in accordance with some embodiments.

For example, as shown in FIG. 6B, the second wire meshes 520 includes a three-dimensional structure 526 which are formed with a first group of filaments 521 and a second group of filaments 523. Filaments 522 of the first group of filaments 521 and filaments 524 of the second group of filaments 523 have the same width, which is greater than the width W1 of the filament 512 (FIG. 4) and also greater than the width W2 of the filament 513 (FIG. 4). As a result, the size of the through holes 525 formed by the filaments 522 and 524 is greater than the size of the through holes 515 formed by the filaments 512 and 514. In the other words, the size of through holes gradually decreases in a flowing direction of the flow of gas.

Figure 7:
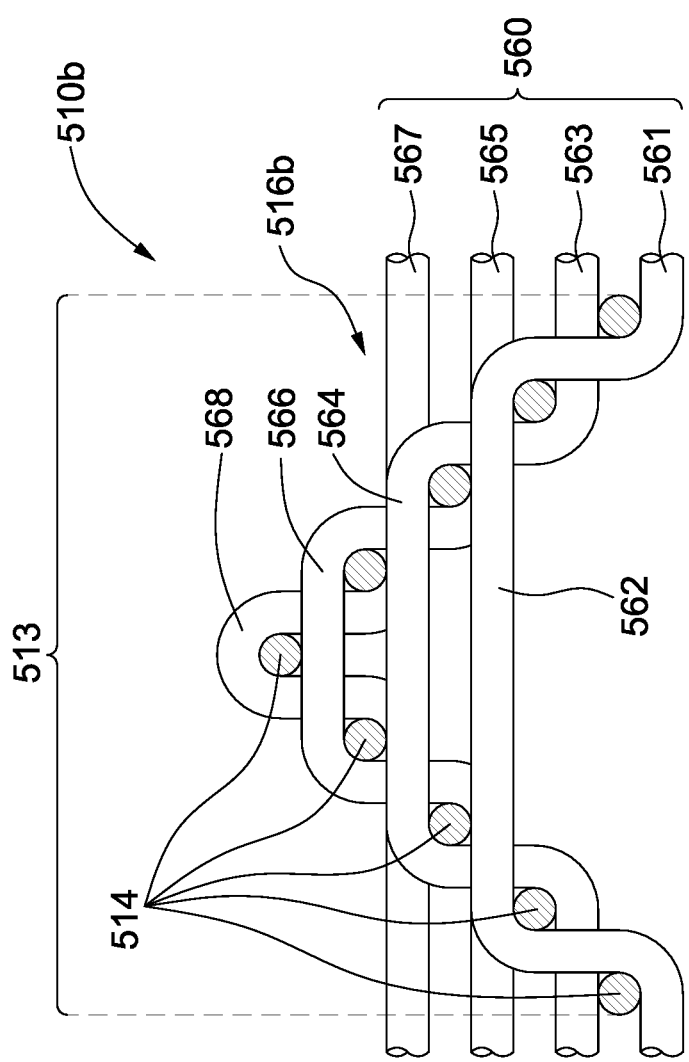
FIG. 7 shows a cross-section view of a three dimensional structure formed in a wire mesh, in accordance with some embodiments.

The filaments for forming the three-dimensional structures may be woven by different methods and is not limited to the embodiments, shown in FIGS. 4 and 5. FIG. 7 shows a cross-sectional view of a three-dimensional structure 516b in a wire mesh 510b. The three-dimensional structures 516b is formed with a first group of filaments 560 and a second group of filaments 513. The second group of filaments 513 may be arranged as filaments 514 shown in FIG. 4. The first group of filaments 560 includes a number of filaments, such as filaments 561, 563, 565 and 567. The filaments 561, 563, 565 and 567 are located on a lateral plane of a pyramid. The filaments 561, 563, 565 and 567 include fastening portions 562, 564, 566 and 568 vertically extending to fasten one or two filaments 514 that are located immediately upon so as to increase the structural strength of the three-dimensional structures 516b. Extension lengths of the fastening portions 562, 564, 566 and 568 in a horizontal direction vary according to a distance between two filaments 514 which are located on the same level. In some embodiments, as shown in FIG. 7, the extension lengths of the fastening portions 562, 564, 566 and 568 gradually decreases.

Structural features of the second filtering assembly 6, in accordance with some embodiments, are similar to those of the first filtering assembly 5 described above, and will not be repeated for the sake of brevity. In some embodiments, for increasing filter efficiency, the size of the through holes of wire meshes of the second filtering assembly 6 may be smaller than the smallest size of the through holes in the wire meshes of the first filtering assembly 5 (e.g., the size of the through holes in the third wire meshes 530). In some embodiments, the number of the wire meshes stacked in the second filtering assembly 6 is less than the number of the wire meshes stacked in the first filtering assembly 5.

Figure 8:
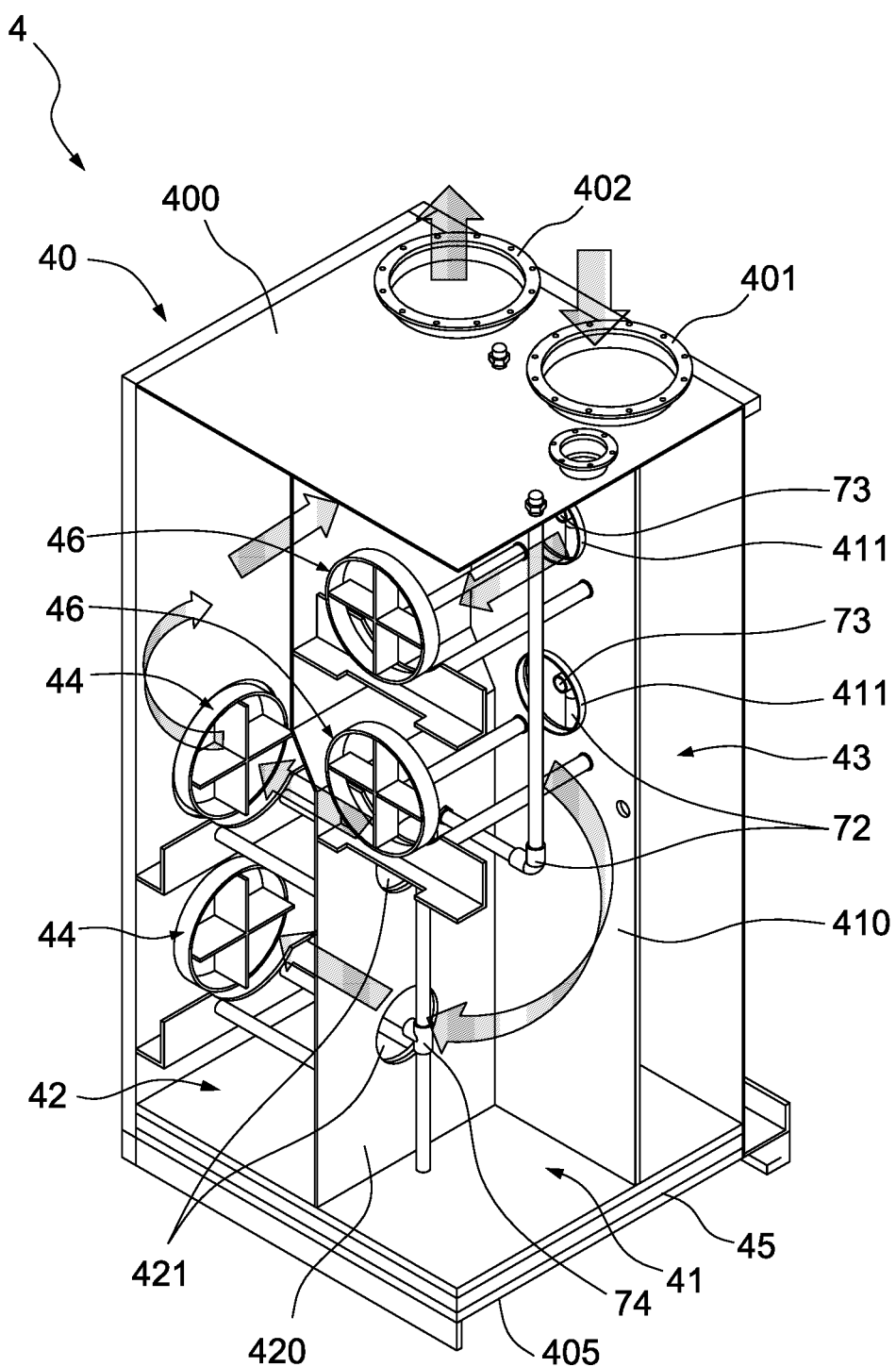
FIG. 8 shows a schematic view of a gas handling tool, in accordance with some embodiments.
Figure 9:
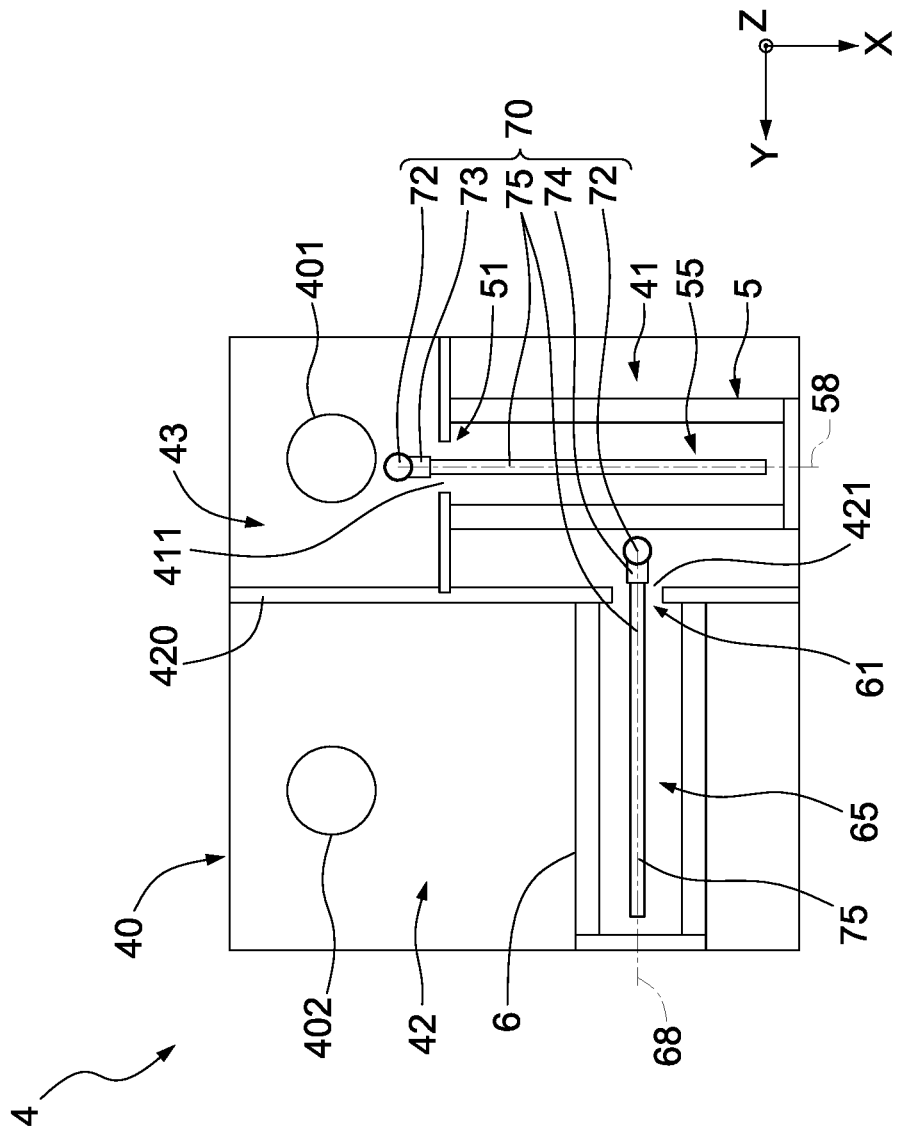
FIG. 9 shows a top schematic view of a gas handling tool, in accordance with some embodiments.

FIG. 8 shows a schematic view of the gas handling tool 4, in accordance with some embodiments, and FIG. 9 shows a top view of the gas handling tool 4, in accordance with some embodiments. For purpose of illustration, the filtering assemblies 5 and 6 are not shown in FIG. 8. In some embodiments, the gas handling housing 40 includes a number of panels to separate the intake chamber 43, the first chamber 41 and the second chamber 42. For example, as shown in FIG. 9, the gas handling housing 40 includes a panel 420 to define the second chamber 42 at a side of the gas handling housing 40 where the gas outlet 402 is formed. In addition, the gas handling housing 40 further includes a panel 410 located at the other side of the gas handling housing 40 where the gas inlet 401 is formed. The panel 410 is perpendicular to the panel 420 to define the intake chamber 43 and the first chamber 41.

In some embodiments, as shown in FIG. 8, the panels 410 and 420 extend from a top panel 400 to a bottom panel 405 of the gas handling housing 40. Additionally, both the panels 410 and 420 include at least one opening for allowing gas to flow from one chamber to another chamber in the gas handling housing 40. For example, as shown in FIG. 8, the panel 410 includes two openings 411 fluidly connected between the intake chamber 43 and the first chamber 41, and the panel 420 includes two opening 421 fluidly connected between the first chamber 41 and the second chamber 42.

In some embodiments, a number of racks 44 and 46 are positioned in the gas handling housing 40 for supporting the filtering assemblies 5 and 6. For example, two racks 46 are positioned in the first chamber 41, and two racks 44 are positioned in the second chamber 42. It will be noted that the number of the racks in each of the first and the second chambers is determined according to the number of filtering assemblies to be positioned in each chamber and will not be limited to the embodiment shown in FIG. 8.

In some embodiments, as shown in FIG. 9, the two racks 46 (only one rack 46 is illustrated in FIG. 9) are positioned corresponding to the openings 411, for supporting the filtering assemblies 5 in the first chamber 41. When the first filtering assembly 5 is positioned on one of the racks 46, the proximal end 51 of the channel 55 defined in the first filtering assembly 5 directly faces the opening 411, and an end of the first filtering assembly 5 abuts against the panel 410. As such, the flow of gas from the intake chamber 43 is guided to enter the first filtering assembly 5 via the proximal end 51 of the channel 55.

Furthermore, the two racks 44 (only one rack 44 is illustrated in FIG. 9) are positioned corresponding to the openings 421, for supporting the filtering assemblies 6 in the second chamber 42. When the second filtering assembly 6 is positioned on one of the racks 44, a proximal end 61 of a channel 65 defined in the second filtering assembly 6 directly faces the opening 421, and an end of the second filtering assembly 6 abuts against the panel 410. As such, the flow of gas from the first chamber 41 is guided to enter the second filtering assembly 6 via the proximal end 61 of the channel 65.

In some embodiments, the first filtering assemblies 5 are oriented in a direction different from the second filtering assemblies 6. For example, as shown in FIG. 9, the first filtering assembly 5 extends in the X-axis direction (i.e., the longitudinal axis 58 of the first filtering assembly 5 is parallel to the X-axis), and the second filtering assembly 6 extends in the Y-axis direction (i.e., a longitudinal axis 68 of the second filtering assembly 6 is parallel to the Y-axis). With such arrangement, the gas handling housing 40 occupies a reduced floor area in a fab, and thus reduces a manufacturing cost.

In some embodiments, the filtering assemblies in the same chamber in the gas handling housing 40 are offset from one the other as seen from a top view. For example, as seen from a top view of a gas handling tool 4c shown in FIG. 10, one of the first filtering assemblies 5 located at an upper side of the first chamber 41 is offset from the other one of the first filtering assemblies 5 located at a lower side of the first chamber 41. A vertical projection of the first filtering assemblies 5 located at the upper side of the first chamber 41 is not completely located on the first filtering assembly 5 located at the lower side of the first chamber 41. The openings 411 for delivery of the flow of gas into the first filtering assemblies 5 are arranged in the similar way.

Figure 10:
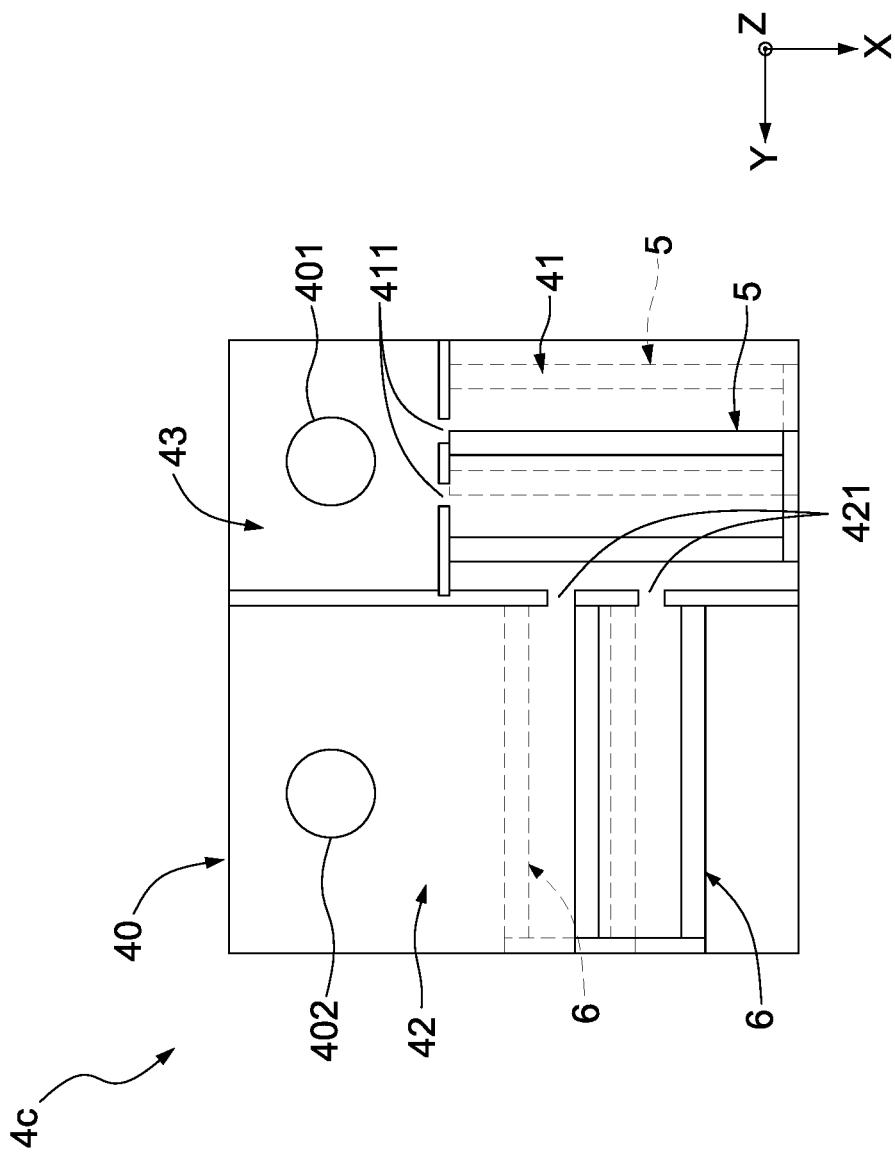
FIG. 10 shows a top schematic view of a gas handling tool, in accordance with some embodiments.

Moreover, as seen from the top view shown in FIG. 10, one of the second filtering assemblies 6 located at an upper side of the second chamber 42 is offset from the other one of the second filtering assemblies 6 located at a lower side the second chamber 42. A vertical projection of the second filtering assembly 6 located at the upper side of the second chamber 42 is not completely located on the second filtering assembly 6 located at the lower side of the second chamber 42. The openings 421 for delivery of the flow of gas into the second filtering assemblies 6 are arranged in the similar way. With the offset arrangements of the filtering assemblies, the filtering assembly, which is located at lower side, may not be contaminated from liquid dropped from other filtering assembly, which is located at the upper side of the same chamber.

Figure 14:
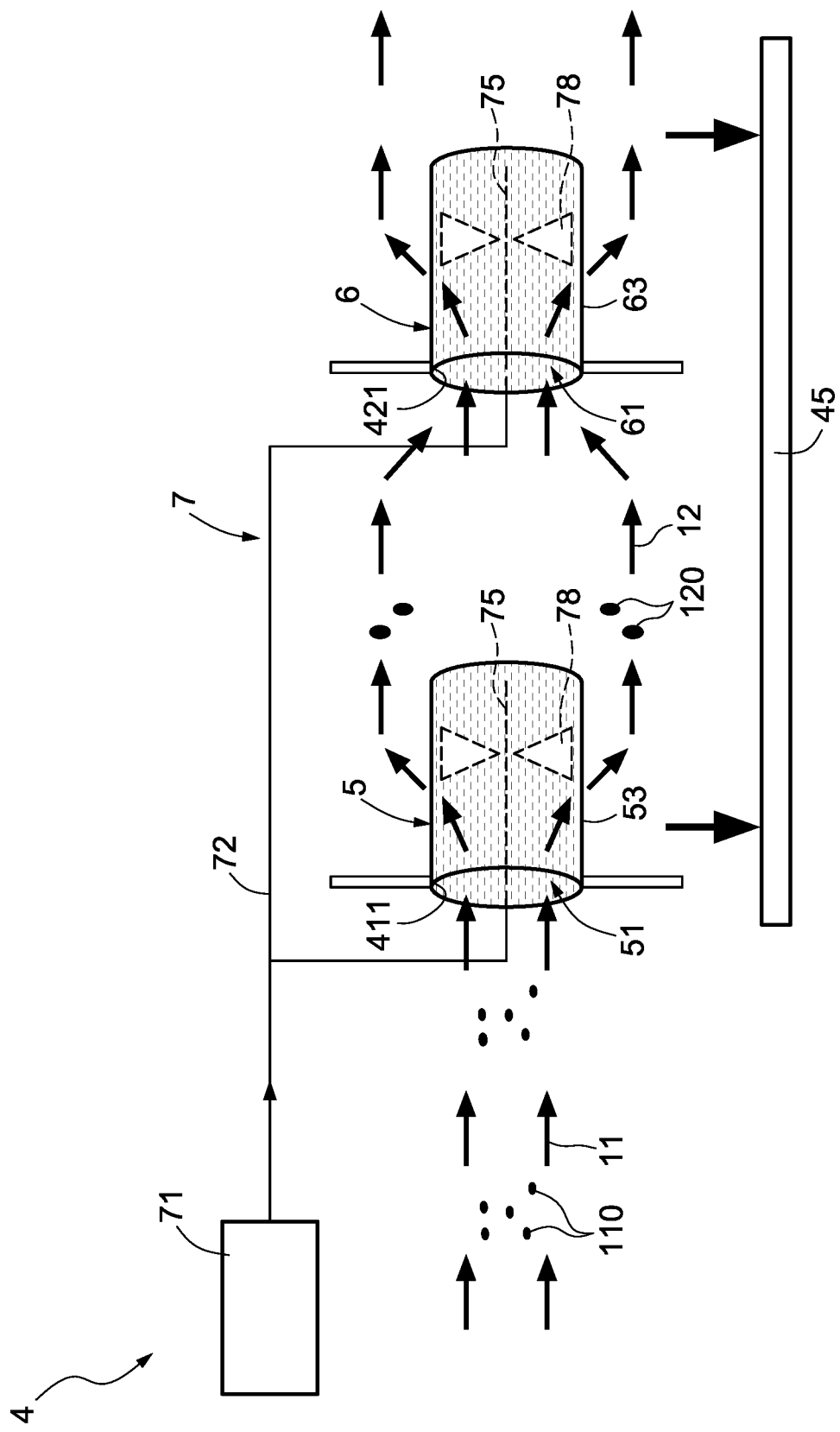
FIG. 14 shows a schematic view of one stage of a method for removing particles in an exhaust gas by a gas handling tool, in accordance with some embodiments.

In some embodiments, the gas handling tool 4 further includes a liquid supplying assembly 70. In accordance with some embodiments of the present disclosure, as shown in FIG. 9, the liquid supplying assembly 70 includes a number of delivery lines 72, a number of connection joints, such as connection joints 73 and 74, and a number of liquid spraying members 75. The delivery lines 72 extend vertically into the gas handling housing 40 (the configuration of delivery line 72 is more clearly depicted in FIG. 8) and are configured to deliver liquid into the gas handling housing 40 from a liquid source 71 (FIG. 14.) In some embodiments, the connection joints 73 and 74 are connected to the delivery lines 72 for facilitating the connection of the liquid spraying members 75. As shown in FIG. 9, the connection joints 73 are positioned corresponding to the openings 411 (only one connection joint 73 and opening 411 are shown in FIG. 9), and the connection joints 74 are positioned corresponding to the openings 421 (only one connection joint 74 and opening 421 are shown in FIG. 9). The liquid spraying members 75 each includes a tube connected to the connection joints 73 and 74 and inserted into the channels 55 and 65 of the first and second filtering assemblies 5 and 6. The liquid spraying members 75 may be located at the center of each of the first and second filtering assemblies 5 and 6. However, it will be appreciated that many variations and modifications can be made to embodiments of the disclosure. In some embodiments, the liquid spraying members 75 are located outside of the channels of the filtering assemblies 5 and 6 and are configured to spray a water mist over the outer surface of the filtering assemblies 5 and 6.

Figure 12:
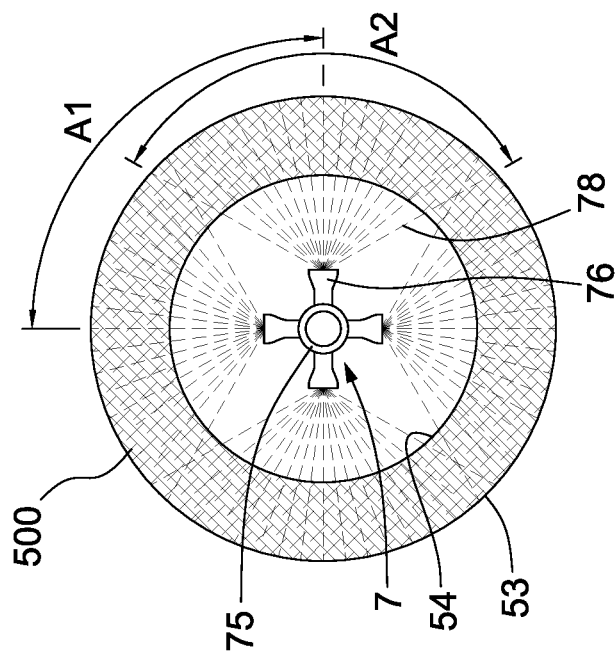
FIG. 12 shows a schematic top view of one stage of a method for supplying water mist over a filtering member by a liquid supplying assembly.
Figure 11:
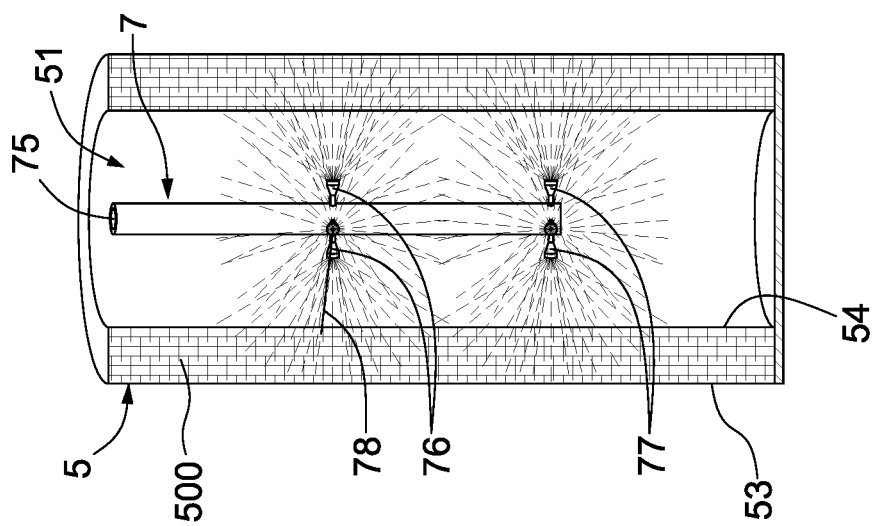
FIG. 11 shows a schematic view of one stage of a method for supplying water mist over a filtering member by a liquid supplying assembly.

FIG. 11 shows a cross-sectional view of the first filtering assembly 5 with the liquid spraying member 75 located inside, in accordance with some embodiments. FIG. 12 shows a top view of the first filtering assembly 5 with the liquid spraying member 75 located inside, in accordance with some embodiments. In some embodiments, a number of upper nozzles 76 and a number of lower nozzles 77 are connected to the liquid spraying member 75 for discharging liquid over all-aspect of the inner surface 54 of the first filtering assembly 5.

The upper nozzles 76 are located closer to the proximal end 51 than the lower nozzles 77. The upper nozzles 76 and the lower nozzles 77 are circumferentially arranged around the liquid spraying member 75 and spaced apart from one another by a fixed or varied distance. As a result, at least two of the upper nozzles 76 are oriented in different directions, and at least two of the lower nozzles 77 are oriented in different directions. In some embodiments, there are four upper nozzles 76 and four lower nozzles 77 connected to the liquid spraying member 75. As shown in FIG. 11, the four upper nozzles 76 are circumferentially arranged around the liquid spraying member 75 and spaced apart from one the other by a fixed distance. That is, an included angle A1 in a circumferential direction of the liquid spraying member 75 between two upper nozzles 76 positioned next to one another is about 90 degrees. In some embodiments, to maximize an area of the inner surface 54 which is directly sprayed by the water mist from the upper nozzles 76 and the lower nozzles 77, a water mist injected by the lower nozzles 77 and the upper nozzles 76 have a cylindrical cone pattern with an arc angle A2 ranged from about 90 degrees to about 135 degrees, for example, 120 degrees. The wafer mist provided by the lower nozzles 77 and the upper nozzles 76 may have a diameter ranged from about 20 µm to about 30 µm.

In some embodiments, the semiconductor processing system 1 further includes a control apparatus 9. The control apparatus 9 is configured for controlling the operation of the processing tool 2 and the exhaust apparatus 3. For example, the control apparatus 9 is configured for controlling the fan 33 and the valve 35 connected to the exhaust conduits. Additionally or alternatively, the control apparatus 9 is configured for controlling the pump 49 connected to the drain line 48. The control apparatus 9 may control the exhaust apparatus 3 using wireless communication techniques. In some embodiments, the control apparatus 9 is configured for monitoring the processing tool 2 and the exhaust apparatus 3. The control apparatus 9 may include a computer.

Figure 13:
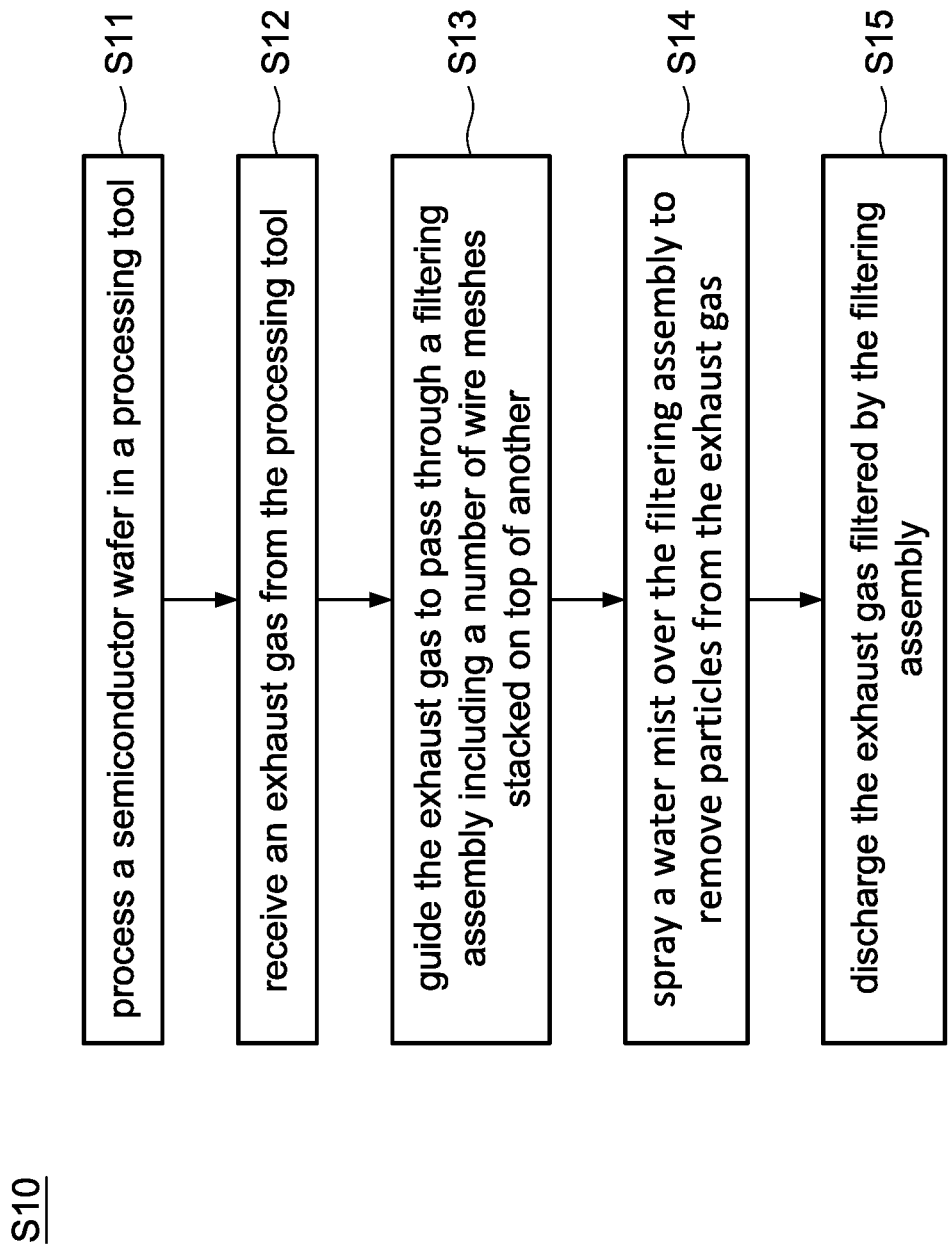
FIG. 13 shows a flow chart illustrating stages in a method for processing a semiconductor, in accordance with some embodiments.

FIG. 13 shows a flow chart illustrating stages in a method S10 for processing a substrate 8, in accordance with some embodiments. For illustration, the flow chart will be described to accompany the schematic view shown in FIGS. 1-12 and 14. Some of the described stages can be replaced or eliminated in different embodiments. Additional features can be added to the semiconductor device structure. Some of the features described below can be replaced or eliminated in different embodiments.

The method S10 includes operation S11, in which a substrate 8 is processed in the processing tool 2. In some embodiments, the processing performed in the processing tool 2 includes a removal of photoresist from the substrate 8. When the photoresist is stripped by a wet process, typically a strong inorganic acid is used at high concentration, with sulfuric acid being most prevalent. However, highly concentrated inorganic acids, and especially sulfuric acid, are highly viscous, and it therefore requires an extended period of rinsing to remove the acid-based liquid from the wafer surface. For example, removal of the sulfuric acid after a photoresist strip process in a process module for single wafer wet processing requires a minimum of 150 seconds when deionized water (DI) followed by an SC-1 mixture ($NH_4OH/H_2O_2/H_2O$) is being used, with the necessary time being approximately twice as long as that when only deionized water (DI) is used to rinse away the acid. In addition, when using an SC-1 mixture significant equipment problems arise due to crystal formation in the exhaust conduit, such as exhaust conduit 31, of the exhaust apparatus, those crystals being the product of ammonia vapor reacting with sulfate residues to form for example ammonium sulfate and ammonium bisulfate. To address the problem above, the method S10 continues with operations S12-S15.

In operation S12, an exhaust gas from the processing tool 2 is received by the gas handling tool 4. In some embodiments, to actuate the exhaust gas 11 from the processing tool 2, the fan 33 is actuated according to signals sent from the control apparatus 9 to create an exhaust gas 11 from the processing tool 2. In some embodiments, during operation S12, the valve 35 mounted in the bypass conduit 34 is normally closed, so that there is no flow of gas passing through the bypass conduit 34.

In operation S13, the exhaust gas is guided to pass through the filtering assemblies 5 and 6 each including a number of wire meshes stacked on top of another. In some embodiments, as shown in FIG. 1, the exhaust gas 11 is guided to flow into the gas handling housing 40 via the gas inlet 401, and then the exhaust gas 11 is sequentially guided to flow through the intake chamber 43, the first chamber 41, the second chamber 42 and leave the gas handling housing 40 via the gas outlet 402. When passing through the first chamber 41, the exhaust gas 11 is filtered by the first filtering assemblies 5 to produce an intermediate gas 12 having less concentration of particles. The intermediate gas 12 is then delivered to the second chamber 42, in which the intermediate gas 12 is filtered by the second filtering assemblies 6 to produce a filtered gas 13 having no or low concentration of particles. In one exemplary embodiment, the ammonium sulfate removal efficiency is greater than 90%.

More specifically, as shown in FIG. 14, to filter the exhaust gas 11 by the first filtering assembly 5, the exhaust gas 11 along with particles 110 is driven to enter the first filtering assembly 5 via the opening 411 and the proximal end 51 and leave the first filtering assembly 5 via its outer surface 53.

Similar, to filter the intermediate gas 12 by the second filtering assembly 6, the intermediate gas 12 along with particles 120 is driven to enter the second filtering assembly 6 via the opening 421 and the proximal end 61 and leave the second filtering assembly 6 via its outer surface 63.

In some embodiments, the size of through holes formed in the wire meshes is in a range of about 2 mm to about 5 mm. Since the size of through holes in the wire meshes is significantly greater than the pore size of a conventional High-Efficiency Particulate Air (HEPA) filter, which generally has a pore size less than 5 micro meters, a pressure drop caused by particles clogged in the filter can be prevented. It will be noted that while the size of through holes in the wire meshes of the present disclosure is much greater than that in a conventional HEPA filter, the filtering efficiency is sustained by filtering the gas flow multiple times with the use of stacked wire meshes.

In operation S14, water mist 78 is sprayed on the tubular-shape filtering structure 500 to remove particles clogged in the tubular-shape filtering structure 500. In some embodiments, as shown in FIG. 14, to produce the water mist 78, liquid, for example but not limit to deionized water is delivered to the gas handling housing 40 from the liquid source 71 via the delivery lines 72. Afterwards, the liquid from the delivery lines 72 is discharged by nozzles, such as upper nozzles 76 and lower nozzles 77 shown in FIG. 11 to form the water mist 78 spraying over the inner surfaces of the first and the second filtering assemblies 5 and 6.

In some embodiments, the water mist 78 facilitates a removal of particles clogged in the first and the second filtering assemblies 5 and 6. Additionally or alternatively, the water mist 78 forms a water film on the wire meshes to absorb particles in the flow of gas. Moreover, the water mist 78 dispersed around the first and the second filtering assemblies 5 and 6 may directly absorb suspending particles before or after its passing through the wire meshes. The liquid sprayed on the first and the second filtering assemblies 5 and 6 flows downward with gravity to the drain conduit 45 and drained outside of the gas handling tool 4.

In the conventional filtering method with the use of HEPA, to make the process conducted in the processing tool 2 in continuous operation despite filter clogging, the bypass conduit 34 is open to allow a portion of exhaust gas to be discharged to the environment without further processing which adversely damages the surrounding. On the contrary, with the in-line self-cleaning method by spraying water mist over the filtering assemblies in the embodiments of present disclosure, the bypass conduit 34 can be normally closed during the semiconductor fabrication process. Therefore, a harm to the environment can be reduced.

In some embodiments, operations S12, S13 and S14 are performed simultaneously. In some embodiments, operation S14 is initiated prior to operations S12 and S13, such that a wafer film can be formed in advance to improve the filtering efficiency. In some embodiments, the supply of the water mist 78 is consecutively performed without interruption. In some embodiments, the supply of the water mist 78 is intermittently performed. In some embodiments, the water mist 78 is injected over the first and the second filtering assemblies 5 and 6 with varied liquid pressures to improve cleaning efficiency. In some embodiments, operation S14 is omitted.

In operation S15, the exhaust gas filtered by the first and the second filtering assemblies 5 and 6 are discharged. In some embodiments, the filtered gas 13 which is filtered by the second filtering assemblies 6 is discharged to the discharge conduit 36 via the gas outlet 402 and the second exhaust conduit 32. With the use of the first and the second filtering assemblies 5 and 6, the concentration of particles in the filtered gas 13 is sufficiently reduced and can be discharged to the environment without adversely affecting the surroundings.

Embodiments of the disclosure provide a method and a tool for removing particles in a gas exhausted from a semiconductor processing tool with a use of filtering assemblies having multiple layers of wire meshes. The wire meshes can adequately remove most of particles in the exhaust gas so as to reduce environmental damage due to semiconductor fabrication. In addition, by providing water mist over the wire meshes, particles clogged in the wire meshes can be sufficiently removed without interruption of the process performed over the semiconductor wafer. As a result, a concern of a throughput decrease due to a maintenance process for replacing or cleaning filtering member is mitigated, and the manufacturing cost is therefore reduced.

In accordance with some embodiments, a system for processing a semiconductor wafer is provided. The system includes a processing tool. The system also includes gas handling housing having a gas inlet and a gas outlet. The system further includes an exhaust conduit fluidly communicating with the processing tool and the gas inlet of the gas handling housing. In addition, the system includes at least one first filtering assembly and at least one second filtering assembly. The first filtering assembly and the second filtering assembly are positioned in the gas handling housing and arranged in a series along a flowing path that extends from the gas inlet to the gas outlet of the gas handling housing. Each of the first filtering assembly and the second filtering assembly comprises a plurality of wire meshes stacked on top of another.

In accordance with some other embodiments, a system for processing a semiconductor wafer is provided. The system includes a processing tool. The system also includes a gas handling housing fluidly communicating with the processing tool. The system further includes a filtering assembly positioned in the gas handling housing and comprising a plurality of wire meshes. The wire meshes are stacked on top of another. In addition, the system includes a liquid supplying member positioned in the gas handling housing. The liquid supplying member is configured to spray a mist over the wire meshes.

In accordance with some embodiments, a method for processing a semiconductor wafer is provided. The method includes receiving an exhausting gas from a processing tool. The method further includes guiding the exhausting gas to pass through a first filtering assembly and a second filtering assembly sequentially. Each of the first filtering assembly and the second filtering assembly comprises a plurality of wire meshes stacked on top of another.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
a processing tool;
a gas handling housing having a gas inlet and a gas outlet;
an exhaust conduit fluidly communicating with the processing tool and the gas inlet of the gas handling housing; and
at least one first filtering assembly and at least one second filtering assembly positioned in the gas handling housing and arranged in a series along a flowing path that extends from the gas inlet to the gas outlet of the gas handling housing, wherein each of the first filtering assembly and the second filtering assembly comprises a plurality of wire meshes stacked on top of another,
wherein the wire meshes of the first filtering assembly are arranged around a first longitudinal axis and stacked in a radial direction of the first filtering assembly that is perpendicular to the first longitudinal axis,
wherein each of the wire meshes comprises a plurality of three dimensional structures, and each of the three dimensional structures includes:
a plurality of first filaments extending in an X-axis direction, wherein in a Y-axis direction, every two adjacent first filaments are arranged in pairs, and the pairs of the first filaments are stacked in a Z-axis direction, wherein a distance between each pair of the first filaments decreases along the Z-axis direction; and
a plurality of second filaments extending in the Y-axis direction, wherein in the X-axis direction, every two adjacent second filaments are arranged in pairs, and the pairs of the second filaments are stacked in the Z-axis direction, wherein a distance between each pair of the second filaments decreases along the Z-axis direction.

2. The system as claimed in claim 1, wherein the wire meshes of the second filtering assembly that are stacked are arranged around a second longitudinal axis, the first longitudinal axis extends in different directions than the second longitudinal axis.

3. The system as claimed in claim 1, wherein the number of the first filtering assemblies and the number of the second filtering assemblies are plural, two of the first filtering assemblies are arranged parallel to another, and two of the second filtering assemblies are arranged parallel to another.

4. The system as claimed in claim 1, wherein the wire meshes of the first filtering assembly that are stacked collectively form a tubular-shaped filtering structure, and the first filtering assembly comprises a plate covering an distal end of the tubular-shaped filtering structure, whereby an exhausting gas flowing into the first filtering assembly through a proximal end of the tubular-shaped filtering structure and leaves the first filtering assembly by passing through the wire meshes.

5. The system as claimed in claim 1, further comprising a liquid spraying assembly positioned in the gas handling housing and configured to spray a mist over the first filtering assembly or the second filtering assembly.

6. The system as claimed in claim 1, wherein a lateral surface is formed with a number of filaments that are arranged parallel to each other.

7. The system as claimed in claim 1, wherein two of the wire meshes of the first filtering assembly are formed with filaments having different widths.

8. A system, comprising:
a processing tool;
a gas handling housing fluidly communicating with the processing tool;
a filtering assembly positioned in the gas handling housing and comprising a plurality of wire meshes, wherein the wire meshes are stacked on top of another; and
a liquid spraying member positioned in the gas handling housing and configured to spray a mist over the wire meshes,
wherein the wire meshes which are stacked collectively form a tubular-shaped filtering structure, and the liquid spraying member is surrounded by the tubular-shaped filtering structure,
wherein each of the wire meshes comprises a plurality of three dimensional structures, and each of the three dimensional structures includes:
a plurality of first filaments extending in an X-axis direction, wherein in a Y-axis direction, every two adjacent first filaments are arranged in pairs, and the pairs of the first filaments are stacked in a Z-axis direction, wherein a distance between each pair of the first filaments decreases along the Z-axis direction; and
a plurality of second filaments extending in the Y-axis direction, wherein in the X-axis direction, every two adjacent second filaments are arranged in pairs, and the pairs of the second filaments are stacked in the Z-axis direction, wherein a distance between each pair of the second filaments decreases along the Z-axis direction.

9. The system as claimed in claim 8, wherein the mist sprayed by the liquid spraying member has a cylindrical cone pattern.

10. The system as claimed in claim 8, wherein the liquid spraying member comprises a plurality of nozzles, and at least two of the nozzles are oriented in different directions.

11. The system as claimed in claim 8, wherein a lateral surface is formed with a number of filaments that are arranged parallel to each other.

12. The system as claimed in claim 8, wherein two of the wire meshes of the filtering assembly are formed with filaments having different widths.

13. The system as claimed in claim 8, further comprising another filtering assembly, wherein the two filtering assemblies are arranged in a series in the gas handling housing.

14. The system as claimed in claim 1, wherein
the plurality of first filaments, which extend in the X-axis direction, form two ladder-shaped lateral surfaces of the three dimensional structure in the Y-axis direction; and
the plurality of second filaments, which extend in the Y-axis direction, form two ladder-shaped lateral surfaces of the three dimensional structure in the X-axis direction.

15. The system as claimed in claim 14, wherein the wire meshes comprises a first wire mesh and a second wire mesh, the size of through holes in the first wire meshes is greater than the size of through holes in the second wire meshes, the through holes in each of the first and second wire meshes are defined at intersections of the first filaments and the second filaments.

16. The system as claimed in claim 8, wherein
the plurality of first filaments, which extend in the X-axis direction, form two ladder-shaped lateral surfaces of the three dimensional structure in the Y-axis direction; and
the plurality of second filaments, which extend in the Y-axis direction, form two ladder-shaped lateral surfaces of the three dimensional structure in the X-axis direction.

17. The system as claimed in claim 16, wherein the wire meshes comprises a first wire mesh and a second wire mesh, the size of through holes in the first wire meshes is greater than the size of through holes in the second wire meshes, the through holes in each of the first and second wire meshes are defined at intersections of the first filaments and the second filaments.

18. A system, comprising:
a processing tool;
a gas handling housing fluidly communicating with the processing tool;
a filtering assembly positioned in the gas handling housing and comprising a plurality of wire meshes, wherein the wire meshes are stacked on top of another; and
a liquid spraying member positioned in the gas handling housing and configured to spray a mist over the wire meshes,
wherein the wire meshes which are stacked collectively form a tubular-shaped filtering structure, and the liquid spraying member is surrounded by the tubular-shaped filtering structure,
wherein each of the wire meshes comprises a plurality of three dimensional structures, and each of the three dimensional structures includes:
a plurality of first filaments extending in an X-axis direction and arranged parallel to each other in a Y-axis direction; and
a plurality of second filaments extending in the Y-axis and arranged parallel to each other in the X-axis direction,
wherein, the first filaments and the second filaments are woven such that, when observed from a top view of the three-dimensional structure, the number of second filaments located underneath one of the first filaments that passes through the center of the three-dimensional structure is greater than the number of second filaments located underneath another one of the first filaments that is immediately adjacent to the one of the first filaments passing through the center of the three-dimensional structure.

19. The system as claimed in claim 18, wherein the wire meshes of the filtering assembly are stacked collectively form a tubular-shaped filtering structure.

20. The system as claimed in claim 18, wherein at least one of the three dimensional structures has a pyramid shape.

* * * * *